US008513707B2

(12) United States Patent
Herberholz

(10) Patent No.: US 8,513,707 B2
(45) Date of Patent: Aug. 20, 2013

(54) RF CMOS TRANSISTOR DESIGN

(75) Inventor: Rainer Herberholz, Cambridge (GB)

(73) Assignee: Cambridge Silicon Radio Ltd., Cambridge (GB)

( * ) Notice: Subject to any disclaimer, the term of this patent is extended or adjusted under 35 U.S.C. 154(b) by 0 days.

(21) Appl. No.: 13/133,808

(22) PCT Filed: Nov. 25, 2009

(86) PCT No.: PCT/GB2009/051593
§ 371 (c)(1),
(2), (4) Date: Jun. 9, 2011

(87) PCT Pub. No.: WO2010/073023
PCT Pub. Date: Jul. 1, 2010

(65) Prior Publication Data
US 2011/0241126 A1   Oct. 6, 2011

(30) Foreign Application Priority Data

Dec. 22, 2008  (GB) .................................. 0823341.3

(51) Int. Cl.
*H01L 27/118*   (2006.01)
*H01L 23/48*    (2006.01)
*H01L 23/52*    (2006.01)
*H01L 29/40*    (2006.01)
*H01L 21/00*    (2006.01)

(52) U.S. Cl.
USPC ........... 257/202; 257/204; 257/206; 257/776; 257/E27.108; 257/E29.136

(58) Field of Classification Search
USPC ................. 257/202, 204, 206, 776, E27.108, 257/E29.136; 438/197
See application file for complete search history.

(56) References Cited

U.S. PATENT DOCUMENTS

| | | | |
|---|---|---|---|
| 5,311,048 A * | 5/1994 | Takahashi et al. | 257/207 |
| 5,917,207 A * | 6/1999 | Colwell et al. | 257/206 |
| 6,002,301 A | 12/1999 | Sugimura et al. | |
| 6,424,006 B1 | 7/2002 | Ponse | |
| 6,710,441 B2 | 3/2004 | Eden et al. | |
| 6,765,245 B2 * | 7/2004 | Bansal | 257/202 |
| 6,858,504 B2 * | 2/2005 | Noble | 438/300 |
| 6,888,750 B2 * | 5/2005 | Walker et al. | 365/185.05 |
| 6,930,324 B2 * | 8/2005 | Kowalski et al. | 257/48 |
| 7,166,898 B2 * | 1/2007 | Briere | 257/401 |
| 7,394,156 B2 * | 7/2008 | Tokunaga et al. | 257/758 |
| 7,469,396 B2 * | 12/2008 | Hayashi et al. | 716/119 |
| 7,586,135 B2 * | 9/2009 | Kwon et al. | 257/250 |
| 7,667,682 B2 * | 2/2010 | Senda et al. | 345/100 |

(Continued)

FOREIGN PATENT DOCUMENTS

| GB | 2374200 A | 10/2002 |
|---|---|---|
| WO | 2009/054936 A2 | 4/2009 |

*Primary Examiner* — Ida M Soward
(74) *Attorney, Agent, or Firm* — Frommer Lawrence & Haug LLP; John W. Branch

(57) ABSTRACT

An improved RF CMOS transistor design is described. Local, narrow interconnect lines, which are located substantially above the active area of the transistor, are each connected to either a source terminal or a drain terminal. The source and the drain terminal are arranged orthogonally to the local interconnect lines and each terminal is significantly wider than a local interconnect line. In an example, the local interconnect lines are formed in a first metal layer and the source and drain terminals are formed in one or more subsequent metal layers.

16 Claims, 14 Drawing Sheets

(56) References Cited

U.S. PATENT DOCUMENTS

| | | | |
|---|---|---|---|
| 7,777,711 B2 * | 8/2010 | Horibata et al. | 345/100 |
| 7,791,111 B2 * | 9/2010 | Kuroyanagi et al. | 257/209 |
| 7,813,616 B2 * | 10/2010 | Shimizu | 385/147 |
| 7,919,792 B2 * | 4/2011 | Law et al. | 257/206 |
| 8,013,395 B2 * | 9/2011 | Kotani | 257/368 |
| 8,063,414 B2 * | 11/2011 | Uchida | 257/206 |
| 2002/0063267 A1 * | 5/2002 | Kumagai et al. | 257/202 |
| 2004/0164407 A1 | 8/2004 | Nakajima et al. | |
| 2005/0067633 A1 * | 3/2005 | Mushika | 257/202 |
| 2006/0017070 A1 | 1/2006 | Ikoma | |
| 2007/0029676 A1 * | 2/2007 | Takaura et al. | 257/758 |
| 2007/0187780 A1 | 8/2007 | Tiemeijer | |
| 2007/0228560 A1 * | 10/2007 | Yuzawa et al. | 257/734 |
| 2007/0296020 A1 * | 12/2007 | Shiba et al. | 257/315 |
| 2008/0035958 A1 * | 2/2008 | Asao | 257/204 |
| 2008/0157381 A1 * | 7/2008 | Ohayashi et al. | 257/758 |
| 2009/0026503 A1 | 1/2009 | Tsuda | |
| 2010/0117120 A1 * | 5/2010 | Yamashita | 257/206 |
| 2011/0266680 A1 * | 11/2011 | Lin et al. | 257/758 |

* cited by examiner

RF CMOS TRANSISTOR DESIGN

BACKGROUND

A typical RF (Radio Frequency) CMOS (Complementary Metal-Oxide-Semiconductor) transistor comprises a comb arrangement of narrow metal lines (also referred to as 'fingers') which connect up the source and drain terminals. Such multi-finger designs were originally developed for technologies which used interconnect comprising aluminium metal layers and tungsten vias and these designs were motivated by the limited number of available interconnect levels, material properties and processing considerations (e.g. the resistance of vias and problems associated with hydrogen gettering). More recently, with the improvement in processing technologies, there has been a change to copper interconnect, a transition to shorter gate length and a reduction in gate-oxide thicknesses. While scaling the gate length significantly enhances the switching speed of the transistor channel, the series resistances of the gate electrode as well as the source and drain increase, limiting the performance gain and deteriorating the noise performance. To mitigate these effects the conventional layout has been modified to include more gate-fingers, with reduced width of the channel width in order to maintain the same overall device width and drive current. Additionally, the layout has been modified to include connections to the gate at both ends.

FIG. 1 is a schematic diagram of a RF CMOS transistor design which shows only a subset of the CMOS layers: active area (also referred to as 'active') 102, gate electrode (also referred to as 'poly', nevertheless the gate electrode may consist of other materials than poly-silicon) 104, metal-1 106 and metal-2 108. In this example, the metal fingers 110 are formed in the metal-2 layer 108 directly above metal-1 (not shown) and the fingers connecting to the source and drain terminals 112, 114 are interleaved. The metal-1 layer 106 provides a gate strap comprising a metal ring 116 around the perimeter of the device.

Use of narrower metal connection lines (where the connection width is indicated by arrow 121), however, results in a reduction in the current carrying capability of the source and drain connections (as limited by electromigration criteria) and also results in an increase in the series resistance of these connections (which results in a voltage drop along the finger connections).

The embodiments described below are not limited to implementations which solve any or all of the disadvantages of known RF CMOS transistors and transistor designs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An improved RF CMOS transistor design is described. Local, narrow interconnect lines, which are located substantially above the active area of the transistor, are each connected to either a source terminal or a drain terminal. The source and the drain terminal are arranged orthogonally to the local interconnect lines and each terminal is significantly wider than a local interconnect line. In an example, the local interconnect lines are formed in a first metal layer and the source and drain terminals are formed in one or more subsequent metal layers.

A first aspect provides a transistor design suitable for fabrication in a MOS process, the transistor design comprising: a plurality of local interconnect lines constrained substantially to above an active area of the transistor; and a source terminal and a drain terminal arranged orthogonally to each of the plurality of local interconnect lines, wherein each terminal is electrically connected to at least one local interconnect line.

The source terminal and the drain terminal may be substantially wider than a local interconnect line.

The source terminal and the drain terminal may be formed in different metal layers.

The transistor design may further comprise a second drain terminal and wherein the drain terminals are arranged either side of the source terminal.

The transistor design may further comprise a gate strap and wherein the gate strap is routed substantially across the centre of the transistor.

The transistor design may further comprise: a dummy gate electrode structure; and a well-tap adjacent to the dummy gate electrode structure, and wherein the dummy gate electrode structure may be electrically connected to the well-tap.

A local interconnect line may comprise at least one narrow portion adjacent to a wider portion, and wherein only the at least one narrow portion is connected directly to one of a source terminal and a drain terminal by means of at least one via.

The transistor design may further comprise a well-tie sharing said active area with the transistor.

A second aspect provides a transistor fabricated using the transistor design described above.

A third aspect provides an integrated circuit die comprising a transistor fabricated using the transistor design described above and a fourth aspect provides a wafer comprising a plurality of such integrated circuit die.

A fifth aspect provides a method of fabricating a transistor comprising: forming an active area on a wafer; forming a plurality of local interconnect lines constrained substantially above the active area in at least a first metal layer; and forming a source terminal and a drain terminal in at least one subsequent metal layer, wherein the source terminal and the drain terminal arranged orthogonally to each of the plurality of local interconnect lines and each terminal is electrically connected to at least one local interconnect line.

The step of forming a source terminal and a drain terminal in at least one subsequent metal layer may comprise: forming the source terminal in at least a second metal layer; and forming the drain terminal in at least a third metal layer.

The step of forming a source terminal and a drain terminal in at least one subsequent metal layer may comprise: forming the drain terminal in at least a second metal layer; and forming the source terminal in at least a third metal layer.

The method may further comprise: forming a gate strap in at least a fourth metal layer, and wherein the gate strap is routed substantially across the centre of the transistor.

In an example, said at least a first metal layer comprises a metal-1 layer and a metal-2 layer, said at least a second metal layer comprises a metal-3 layer, said at least a third metal layer comprises a metal-4 layer and a metal-5 layer, and said at least a fourth metal layer comprises a metal-6 layer.

Further aspects provide a transistor design substantially as described with reference to any of FIGS. 2-11 and 13-14 of the drawings and a transistor fabricated according to a design substantially as described with reference to any of FIGS. 2-11 and 13-14 of the drawings.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
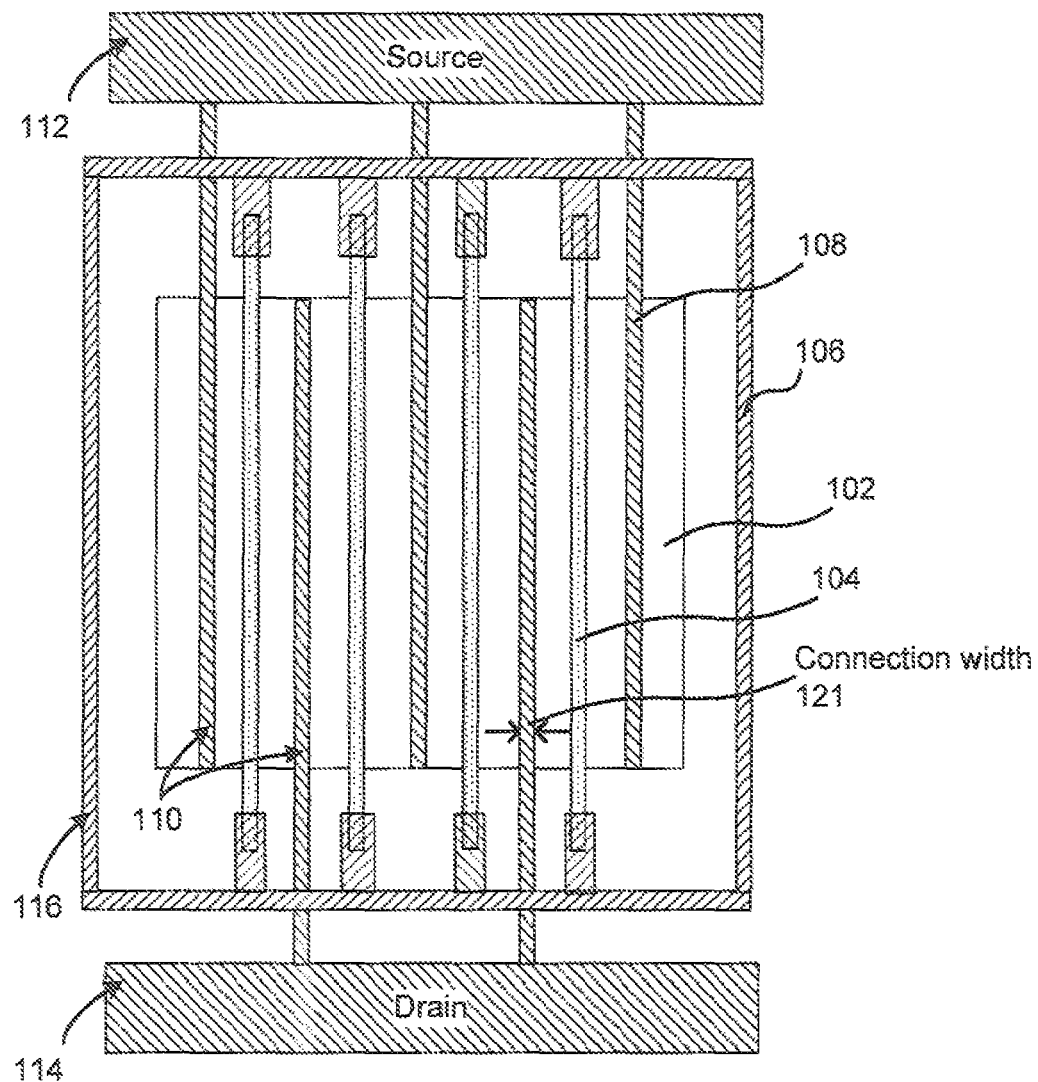
FIG. 1 is a schematic diagram of a conventional RF CMOS transistor design.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 2:
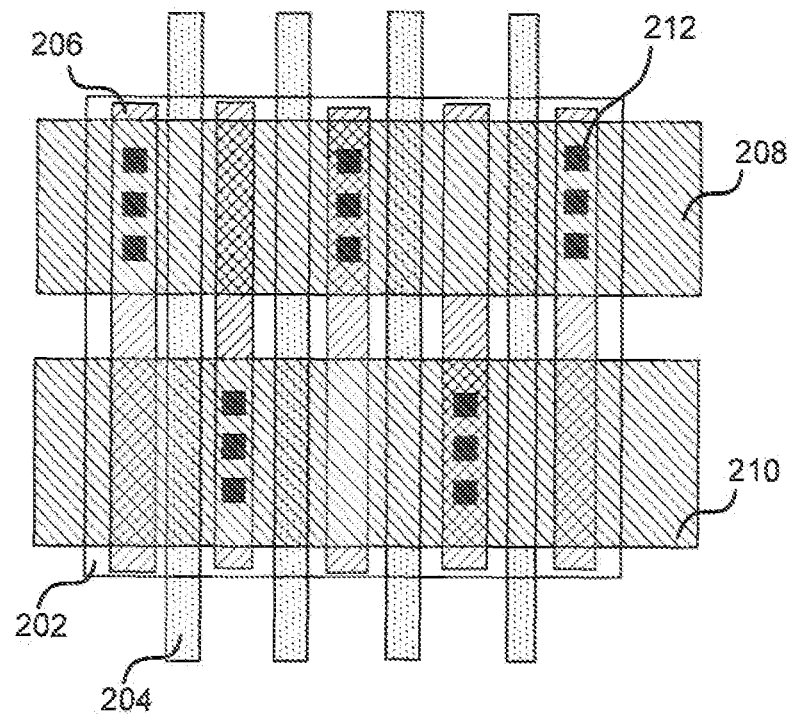
FIGS. 2-11 show schematic diagrams of aspects of examples of improved RF CMOS transistor designs.

FIG. 2 is a schematic diagram of aspects of an improved RF CMOS transistor design which shows only a subset of the CMOS layers, including active area (which may be referred to herein as 'active') 202, gate electrode (which may be referred to herein as 'poly') 204, via 212 and various features 206, 208, 210 which are implemented in one or more metal layers. It will be appreciated that a complete RF CMOS transistor design comprises other layers (e.g. contact) and other features (e.g. well-ties) which are not shown in FIG. 2 for reasons of clarity. Subsequent diagrams may show fewer/more layers and may include some of these additional features, however it will be appreciated that diagrams are likely to show a reduced feature and/or layer set for reasons of clarity.

In the improved RF CMOS transistor design shown in FIG. 2, narrow metal lines 206 are used as a local interconnect above the active area 202 (i.e. they do not extend, or do not extend substantially, beyond the edge of the active area 202). The narrow metal lines may be referred to herein as being substantially 'within' the active area 202. This does not imply that the metal lines are embedded within the active area but instead refers to the overlapping of layers when the design is viewed (e.g. as shown in FIG. 2), in which case the narrow metal lines are substantially within the outline of the area occupied by the active area (which when fabricated is a layer below the metal layer used for the narrow metal lines). The local interconnect lines may extend beyond the active area for example to accommodate an additional via for the connection to the source or drain terminal lines. These narrow metal lines 206 may be formed from one or more metal layers which are close to the substrate, e.g. in metal-1 (the first metal layer). The source and drain terminals 208, 210 (or 210, 208 as the two may be swapped over) are formed from one or more metal layers which are above the metal layer used for the local interconnect (e.g. in metal-2 and/or above). These terminals 208, 210 are arranged orthogonally (or substantially orthogonally) to the gates and to the local interconnect 206 and comprise lines which are significantly wider (e.g. three or more times wider) than the local interconnect lines. Vias 212 (e.g. two or more vias) are used to electrically connect between the local interconnect lines 206 and the source and drain terminals 208, 210.

By constraining the narrow lines to local interconnect above (or substantially above) the active area and using wider source and drain terminals which are orthogonal (or substantially orthogonal) to the narrow lines, the narrow fingers of metal are not used to extract current from the transistor (unlike in known devices) which alleviates problems associated with the current carrying capability of these narrow lines of metal and also reduces the impact of the resistance of the narrow fingers of metal, as well as the high capacitance contribution from long runs of many parallel narrow metal lines. The orthogonal routing of the source and drain terminals enables the use of significantly wider lines (as shown in FIG. 2) and provides an additional degree of freedom, allowing a trade off between lower capacitance and resistance.

Figure 3:
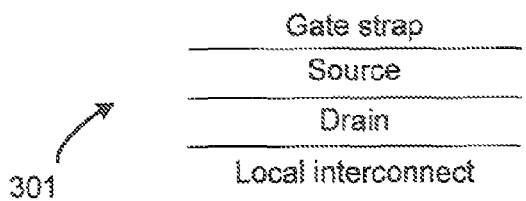
Figure 3:
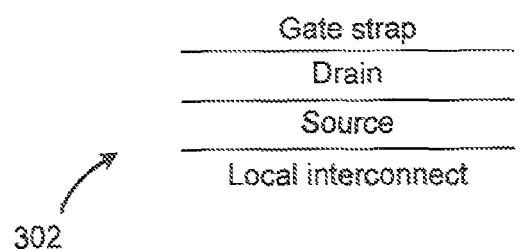
Figure 3:
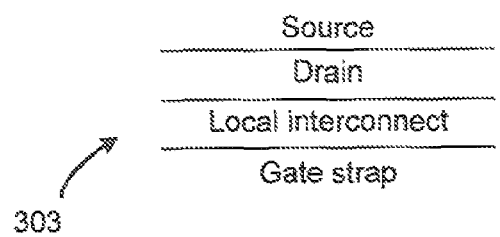
Figure 3:
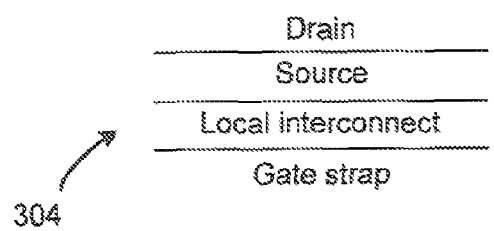
Figure 4:
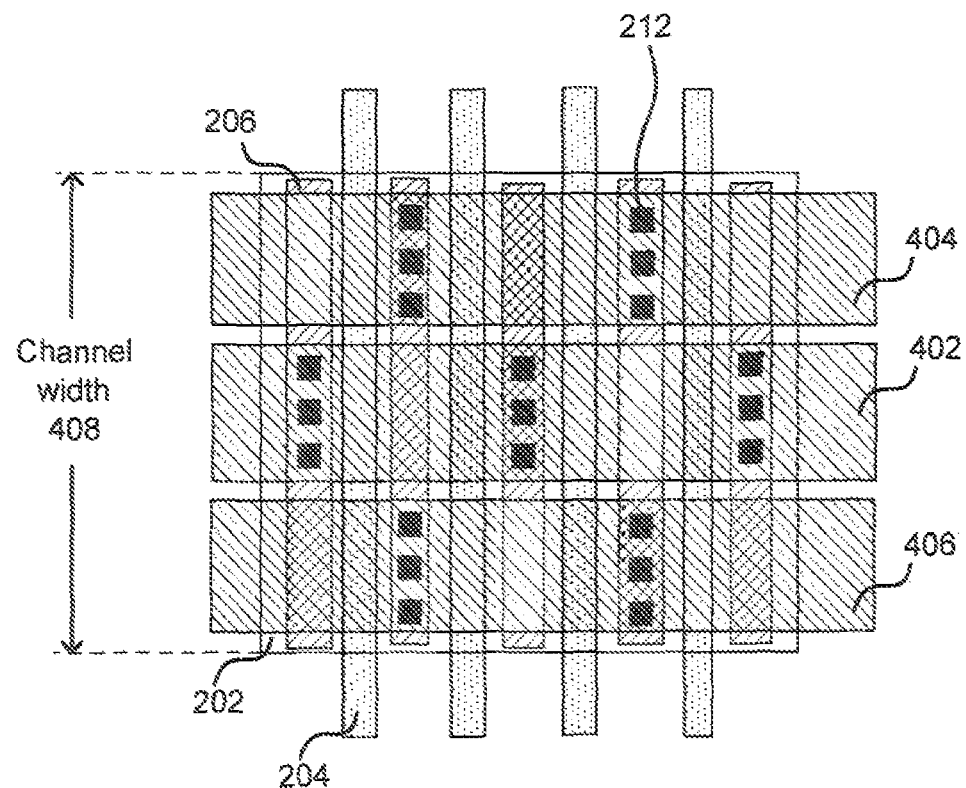
Figure 5:
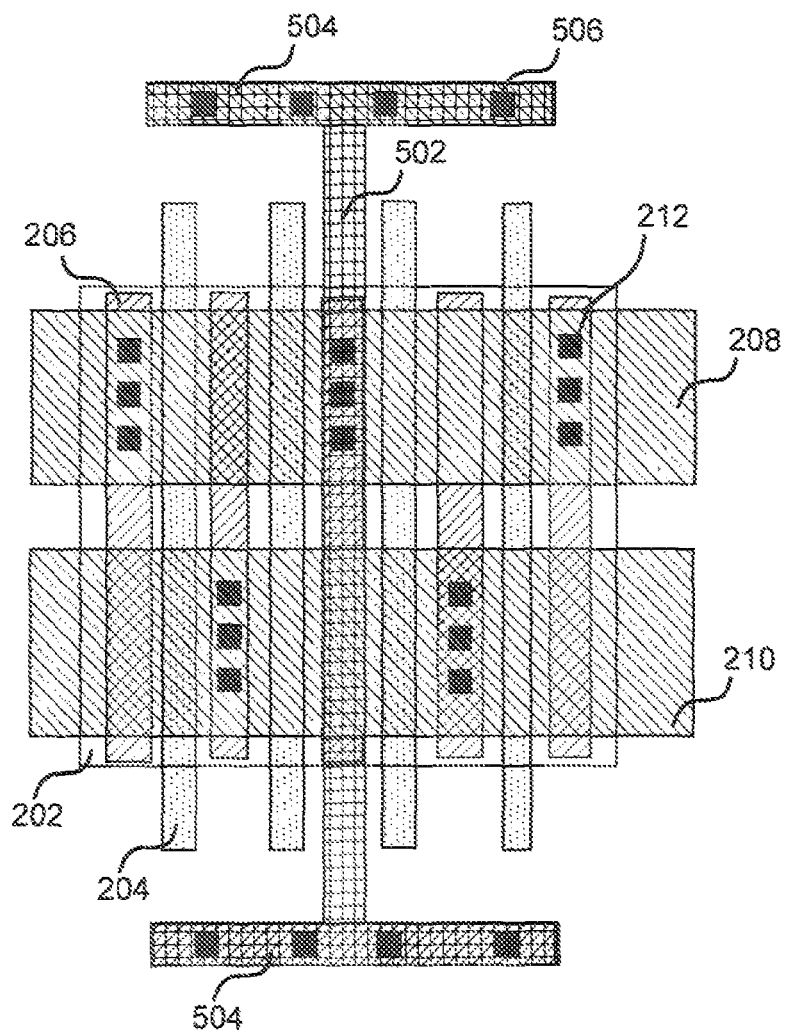
Figure 6:
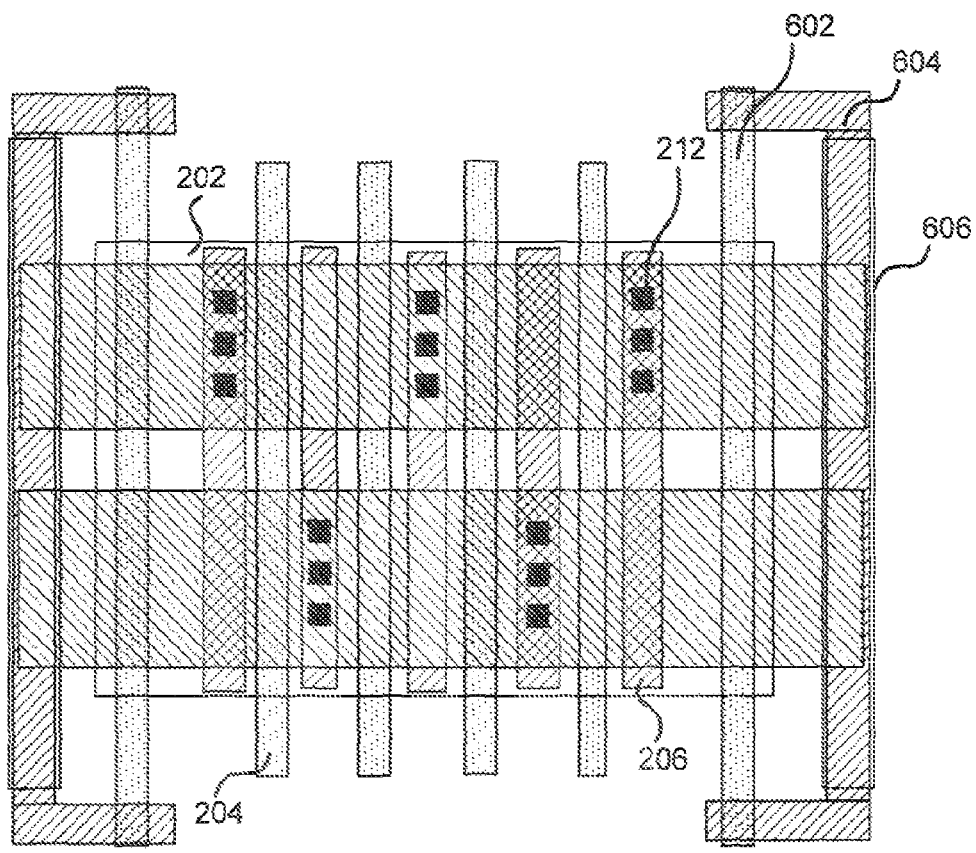
Figure 7:
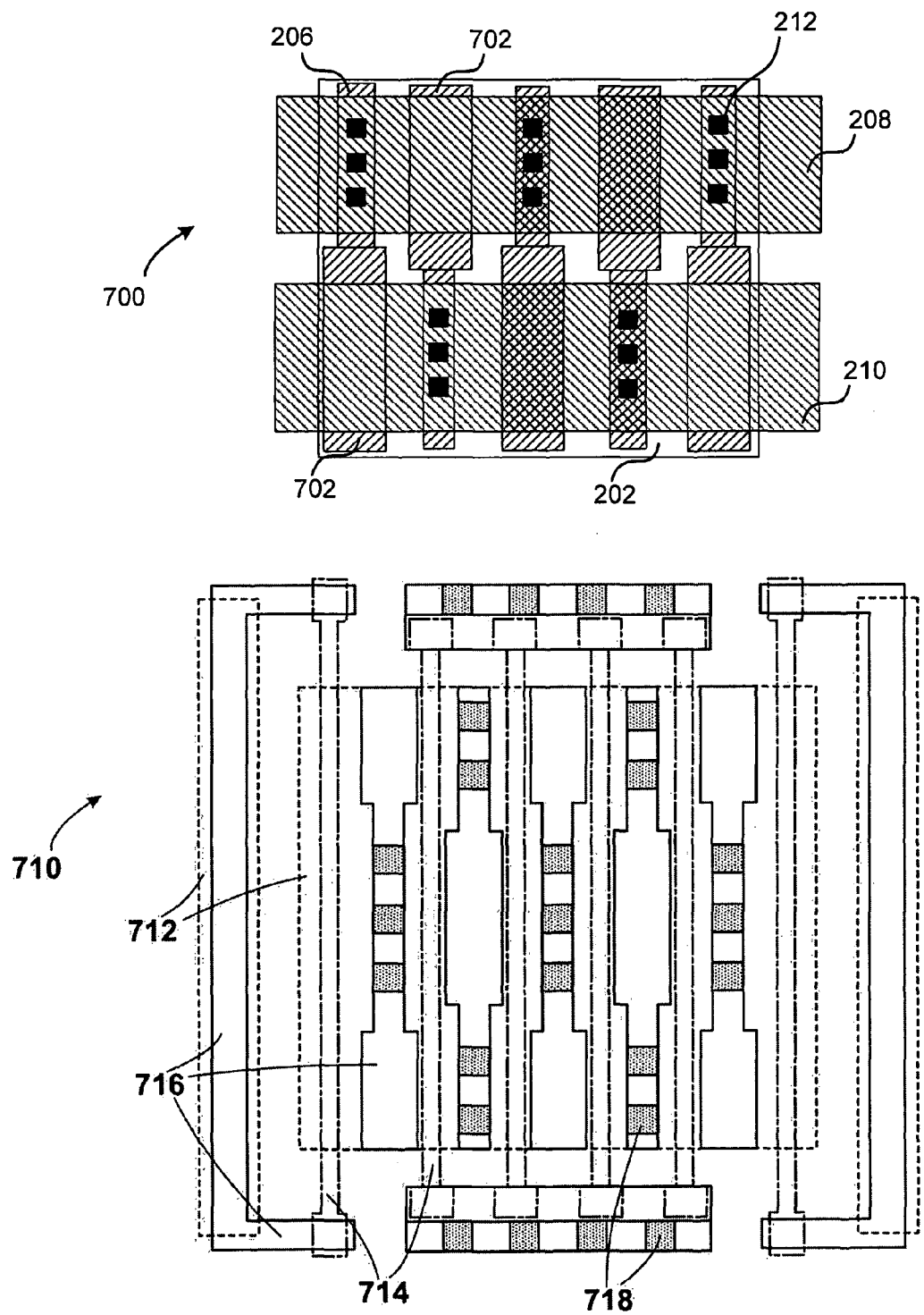
Figure 8:
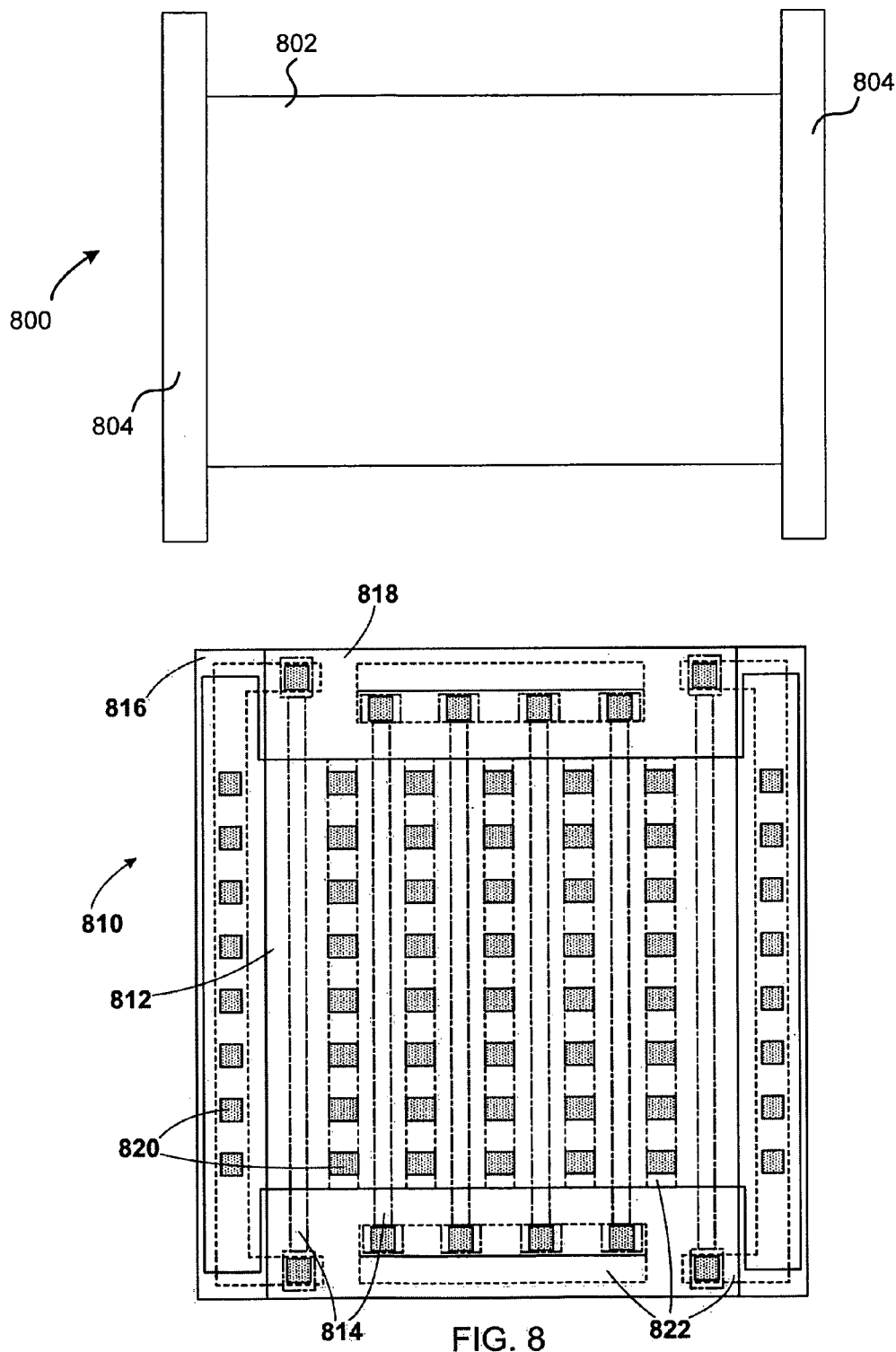
Figure 9:
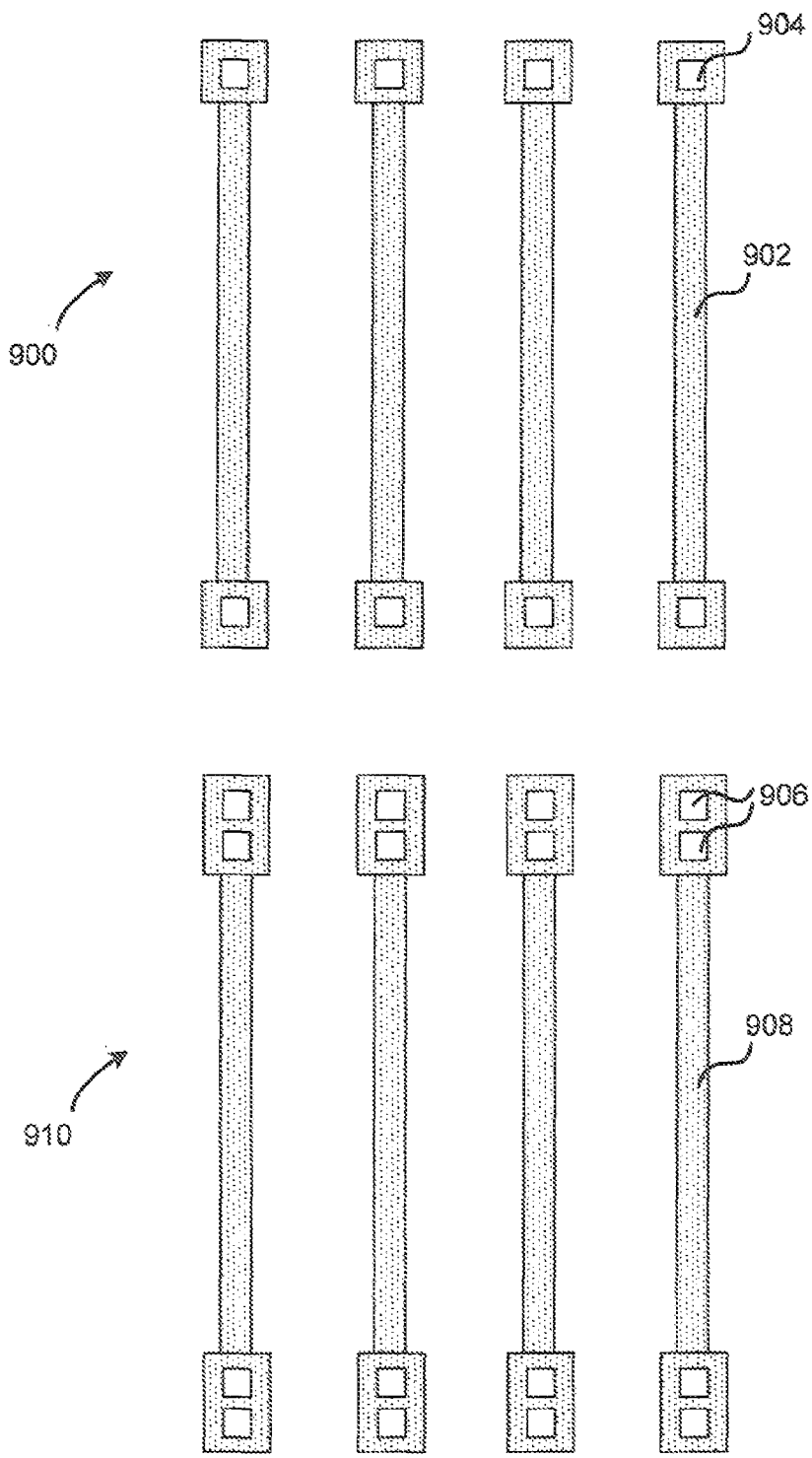
Figure 10:
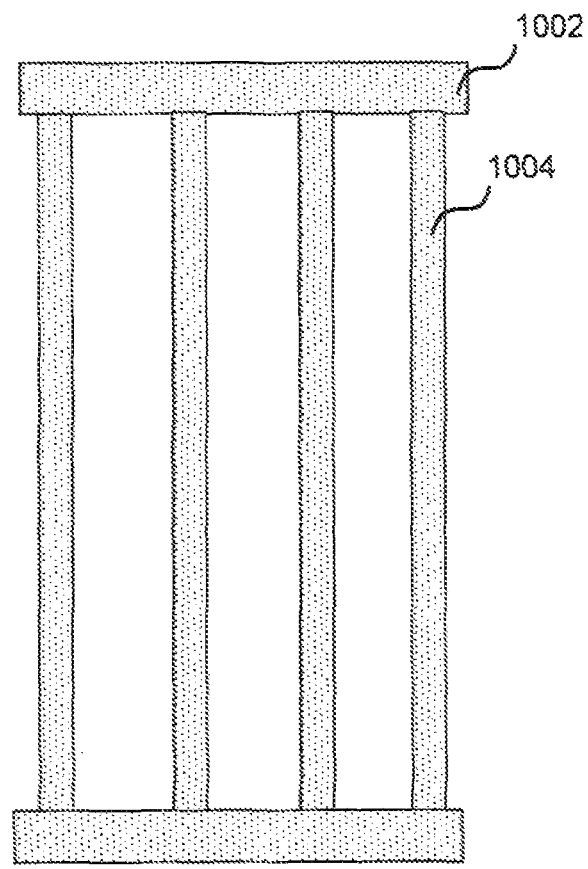

In addition to the use of narrow local interconnect lines above the active area and orthogonal, wider source and drain terminals, there are a number of further optimisations which may be included within an improved RF CMOS transistor design and these include:

running the source and drain terminals in different metal layers (as shown in FIG. 3), use of two drain terminals and one source terminal (as shown in FIG. 4) or other symmetric arrangement of terminals, use of a narrow gate strap across the centre of the device (as shown in FIG. 5) instead of a ring around the periphery of the device (as shown in FIG. 1), tying off dummy gates by connecting them to well-taps (as shown in FIG. 6), widening portions of the local interconnect (as shown in FIG. 7), use of a butted well-tie (as shown in FIG. 8) i.e. where the well-tie is on the same active area as the transistor, use of more than one contact per end of the gate connections (as shown in FIG. 9), and forming a continuous connection between the gate electrode (or poly) of adjacent gates (as shown in FIG. 10).

Each of these optimisations is described in more detail below and it will be appreciated that any one or more of these optimisations may be combined with the features shown in FIG. 2 and described above to provide further examples of improved RF CMOS transistor designs. For example, FIG. 11, which is described in detail below, shows an improved RF CMOS transistor cell (which may be referred to as the 'orthocell') which includes a number of the optimisations listed above.

In a first example optimisation, the source and drain terminals 208, 210 may be run in different metal layers. For example, if the local interconnect 206 is implemented in metal-1, the source terminal may be formed in metal-2 and the drain terminal may be formed in metal-3 (or the drain terminal may be formed in metal-2 and the source terminal may be formed in metal-3). FIG. 3 shows four different examples 301-304 of sequences of structures which may be implemented in different metal layers—it will be appreciated that any one of these structures may be implemented in more than one metal layer and/or that metal layers may not be used for these structures (e.g. the four structures may be implemented in metal layers 1, 2, 4 and 5). In the first and third examples 301, 303, the source terminal is implemented in a metal layer which is above the drain terminal and in the second and third examples 302, 304, the drain terminal is implemented in a metal layer which is above the source terminal. The selection of the sequence of layers in which the terminals are implemented (e.g. source above drain or vice versa) may be design dependent. For example, the selection may be dependent on whether the design is more sensitive to source or drain capacitance.

In the examples shown in FIG. 3 the gate strap is implemented either in the lowest of the metal layers which is used for any of the structures shown (which may be metal-1) or in a layer above the local interconnect, source and drain terminals (e.g. in metal-4). The examples also show the local interconnect being implemented in a metal layer below both the source and drain terminals in all cases.

In an example, the local interconnect may be implemented in metal layers metal-1 to metal-n (where n is an integer), the source and drain terminals may be implemented in metal layers metal-(n+1) to metal-m (where m is an integer) and the gate strap may be implemented in a layer metal-($\geqq$m+1).

Running the source and drain lines at different metal levels enables the separation of the lines (in the plane of the wafer) to be smaller (e.g. the spacing could be smaller than the minimum spacing allowed between two metal lines in the same layer for the particular process used) to reduce the resistance of the source and drain connections. Furthermore running the source and drain lines at different metal levels reduces the source to drain capacitance.

In a second example optimisation, the transistor may comprise two drain terminals and one source terminal, or other symmetric arrangement of source and drain terminals. FIG. 4 shows a schematic diagram of aspects of an improved RF CMOS transistor design which includes this optimisation and comprises one source terminal 402 and two drain terminals 404, 406 which are arranged either side of the source terminal 402. In an example, this optimisation may be combined with the first example optimisation such that the source and drain terminals are formed in different metal layers.

In a specific example of the structure shown in FIG. 4 and the sequence of layers shown in example 301 or 302 of FIG. 3, the local interconnect lines 206 may be implemented in metal-1 and metal-2, the outer terminals 404, 406 (which may be drain/source) may be implemented in metal-3, the central terminal 402 (which may be source/drain) may be implemented in metal-4 and metal-5 and the gate strap (not shown in FIG. 4) may be implemented in metal-6.

The use of two drain terminals 404, 406, one either side of the source terminal 402 provides a symmetric arrangement and this results in a transistor design which is less susceptible to damage from a high voltage pulse on the drain, which may be a result of electrostatic discharge (ESD). The symmetrical design means that concentrated snapback effects at one end of the local interconnect (or other narrow metal line which is connected to the drain terminal, in conventional designs) are less likely to occur and as a result the device can withstand greater stresses before damage occurs (e.g. the gate oxide breaking down or a metal track melting). This may be advantageous as RF transistors are often used in regions where it is beneficial to provide a low level of ESD protection (e.g. in order to reduce the parasitic capacitance).

For very narrow channel widths (where channel width is indicated by arrow 408 in FIG. 4), the process design rules may not allow the placement of a satisfactory number of vias 212 on the connections to the two drain lines 404, 406. In such an instance, the resistance drop across the (metal-1) local interconnect becomes negligible and only one orthogonal drain line may be used (as shown in FIG. 2) instead of two drain lines (as shown in FIG. 4).

In a third example optimisation, the transistor design may include a narrow gate strap across the centre of the device instead of a ring around the periphery of the device (as shown in FIG. 1). FIG. 5 shows a schematic diagram of aspects of an improved RF CMOS transistor design which includes this optimisation (gate strap 502).

In the example shown, the gate strap 502 comprises a narrow line and by routing this across the centre of the device, it follows the shortest path. It is not necessary to make the gate strap a wide line and instead the width of the line may be selected such that the resistance of the gate strap is negligible in comparison to the resistance of the gate. As long as the resistance between both ends of the gate strap are at least an order of magnitude less than the resistance of the gate itself, further reduction in the resistance of the gate strap (e.g. through use of a wider line) does not provide any significant benefits.

By routing source and drain above the active transistor area and the gate strap across the centre of the cell, the overall footprint of the cell is reduced. In an example, the footprint of the cell may be reduced to around 70% of a conventional cell which routes the gate strap around the periphery of the device (e.g. as shown in FIG. 1). Additionally, this optimisation avoids potential problems associated with inductive coupling to the sensitive gate node which are caused by the ring gate strap 116 (of FIG. 1) forming an inductor around the device, and which may be exacerbated by tiling of the conventional design. Furthermore, this optimisation reduces the parasitic (gate to substrate) capacitance. This optimisation also makes it easier to tile individual transistor cells to create a transistor array, as described in more detail below.

The gate signal may be passed up through the lower metal levels at the top and bottom edges of the cell (through the structures 504 which include features in each metal level connected by vias 506) which enables the gate to be routed to in any metal level. The gate strap 502 itself may be implemented in any metal level which is above the local interconnect, source and drain terminals, e.g. as shown in examples 301 and 302 in FIG. 3 (e.g. in metal-3 or above where the source and drain terminals are implemented in the same metal level or in metal-4 or above where the source and drain terminals are implemented in different metal levels, as described in the first example optimisation). Examples 303 and 304 in FIG. 3 are not compatible with this third example optimisation.

In a fourth example optimisation, the dummy gates 602 may be tied off by connecting them to well-taps (e.g. using metal track 604 which connects to the region of active area 606). FIG. 6 shows a schematic diagram of aspects of an improved RF CMOS transistor design which includes this optimisation. This prevents variation due to a floating gate at unknown potential. It will be appreciated that FIG. 6, like all the design examples shown in any of the figures, only shows a subset of the CMOS layers for reasons of clarity (e.g. contacts between the metal track 604 and the active area 606 are not shown in FIG. 6).

In a fifth example optimisation, portions 702 of the local interconnect may be widened where the portion is not connected directly to a source/drain terminal by means of vias. FIG. 7 shows a schematic diagram 700 of aspects of an improved RF CMOS transistor design which includes this optimisation and shows only the active area 202, local interconnect 206, 702, source and drain terminals 208, 210 and vias 212 between these terminals and the local interconnect. By widening the portions 702 of the local interconnect where all the current is carried in the local interconnect, the IR (or voltage) drop is reduced. In the example shown, the widened areas are offset vertically between source and drain connections which keeps the capacitance low.

FIG. 7 also shows a second example 710 of an improved RF CMOS transistor design which combines this optimisation with a number of other optimisations (e.g. use of two drain lines and one source line and tying off of the dummy gates). This example shows four different levels of the design: active 712, poly 714, metal-1 716 and via-1 718 (which provides an electrical connection between metal-1 716 and metal-2, not shown).

A sixth example optimisation involves moving the well-tie (which may also be referred to as a well-tap) closer to the bulk of the transistor and the limit of this is to use a butted well-tie, as shown in FIG. 8. By moving the well-tie closer, the substrate resistance is reduced and this is enabled by the elimination of the ring structure of the gate strap around the periphery of the device (e.g. as shown 116 in the conventional design of FIG. 1). The overall size of the device is also reduced.

FIG. 8 shows two schematic diagrams of aspects of an improved RF CMOS transistor design which includes a butted well-tie (i.e. where the well-tie is on the same active area as the transistor). The use of a butted well-tie results in the substrate network having a significantly lower resistance since the path to the well-pick-up does not pass under the isolation oxide (e.g. Shallow Trench Isolation, STI) and hence results in a device with a lower noise figure. The first diagram 800 shows the merged active areas: the first area 802, which forms the bulk of the transistor, and the second area 804 for the well-tie. In the example shown there is a well-tie region 804 on each side of the transistor. Using the example of an NMOS, the second diagram 810 shows more levels of the design: active 812, poly 814, P+ 816, N+ 818, contact 820 and metal-1 822, and also shows the fourth example optimisation described above (the connection of the dummy gates to the well-taps).

In an eighth example optimisation, more than one contact may be used at each end of the gate connections, as shown in FIG. 9. FIG. 9 shows two schematic diagrams 900, 910 which show only a part of a RF CMOS transistor design and only show two layers: gate electrode and contact. The first diagram 900 shows one contact 904 at each end of each gate 902. The second diagram 910 shows the optimisation with a pair of contacts 906 at the ends of each gate 908. This optimisation reduces the resistance of the gate connection.

In a ninth example optimisation, the gate electrode of adjacent gates may have a continuous connection, as shown in FIG. 10. FIG. 10 shows a schematic diagram which shows only a part of an improved RF CMOS transistor design and only shows the gate electrode layer. It can be seen, in particular by comparison of FIG. 10 and the first diagram 900 in FIG. 9, that the end portion 1002 of the gates 1004 is continuous and connects all the gates. This helps to ensure that there is the same potential on each of the gates.

As described above, the local interconnect may be formed from one or more metal layers and in many of the examples the local interconnect is shown as being implemented in metal-1. Whilst use of more than one metal layer for the local interconnect (e.g. metal-1 and metal-2) increases the parasitic capacitance, it does reduce the resistance of the local interconnect and increase the current carrying capability of the local interconnect which may be beneficial for some applications (e.g. as the process dimensions reduce further with improvements in processing techniques).

Figure 11:
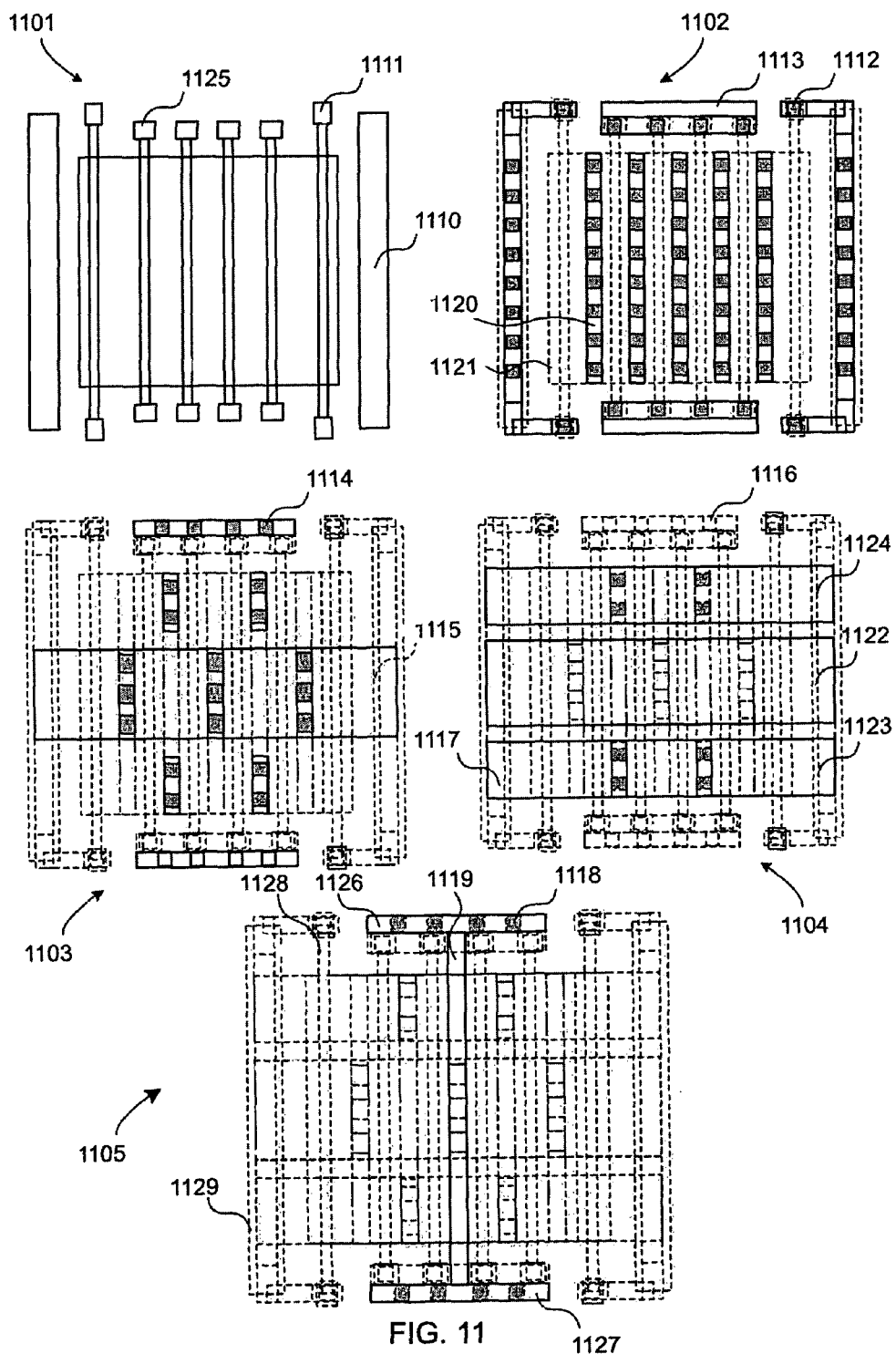

The above description details a number of different optimisations which may be implemented independently or in any combination. FIG. 11 shows a further example of an improved RF CMOS transistor design which incorporates a number of the optimisations described above.

FIG. 11 shows five views 1101-1105 of the design in which additional layers are added to subsequent views:
- the first view 1101 shows the active area 1110 and gate electrode 1111,
- the second view 1102 adds the contact layer 1112 and metal-1 layer 1113,
- the third view 1103 adds via-1 1114 and metal-2 1115,
- the fourth view 1104 adds via-2 1116 and metal-3 1117, and
- the fifth view 1105 adds via-3 1118 and metal-4 1119.

This example of an improved RF CMOS transistor uses narrow metal lines 1120 in metal-1 as a local interconnect and these narrow metal lines are constrained to above the active area 1121 of the transistor (as shown in the second view 1102), additionally the source and drain terminals 1122-1124 are routed orthogonally to the gates 1125 using wider lines than the local interconnect lines 1120. The design in FIG. 11 also shows the source and drain terminals 1122-1124 being run in different metal levels, with the source terminal 1122 being run in metal-2 and the two drain terminals 1123-1124, arranged either side of the source terminal 1122, being run in metal-3. The metal-4 layer 1119 provides a narrow gate strap across the centre of the device and the gate signal is passed up through the lower metal levels (e.g. metal-1 to metal-4) at the top and bottom edges 1126, 1127 of the cell (through via-1, via-2 and via-3). The dummy gates 1128 are also tied off by connecting them to the well-taps 1129.

The improved RF CMOS transistor design shown in FIG. 11 has reduced extrinsic resistances and capacitances compared to conventional designs. In particular, the design has reduced gate resistance per unit length and concerns about the series resistance and current carrying capability of the source and drain connections are reduced (compared to conventional designs). The layout area of this design is also smaller than a conventional cell (e.g. around 70% of the size of a conventional cell).

Figure 12:
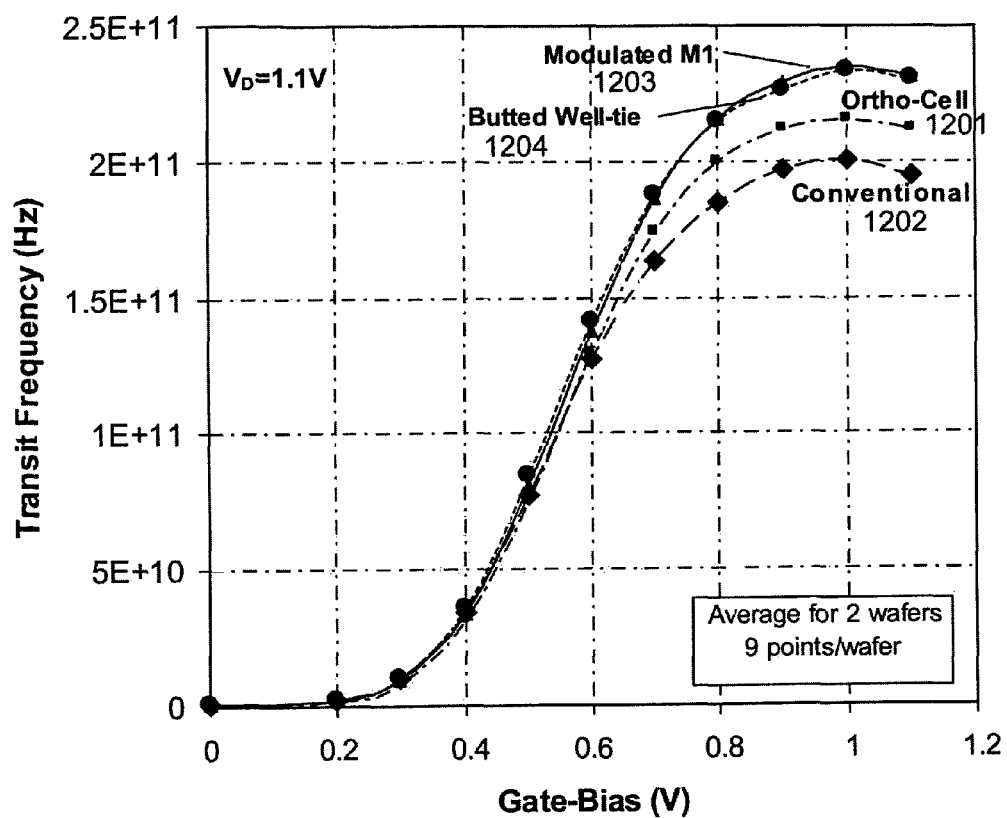
FIG. 12 shows a graph of preliminary performance measurements which have been obtained using the improved RF CMOS transistor design shown in FIG. 11.

FIG. 12 shows a graph of preliminary performance measurements which have been obtained using a design such as that shown in FIG. 11 and which is referred to in FIG. 12 as the 'ortho-cell' (line 1201). The graph shows results for a device in 40 nm CMOS with a drawn channel width of 1.1 um and gate length of 0.04 um and four gate fingers (NF=4). The graph shows the improvement in transit frequency which can be achieved compared to a conventional design (line 1202). Transit frequency is not an ideal metric for evaluation of the design for a number of reasons, including the fact that it is insensitive to the gate resistance. The transit frequency is proportional to the transconductance of the device and inversely proportional to the sum of the gate to source and gate to drain capacitances. However, it can be seen from FIG. 12 that the ortho-cell design (e.g. as shown in FIG. 11) has a higher transit frequency compared to the conventional design.

FIG. 12 also shows the improvement that can be achieved through the independent use of two of the optimisations described above. Both the modulation of the local interconnect ('Modulated M1' line 1203, which is described above with reference to FIG. 7) and the butted well-tie (line 1204, which is described above with reference to FIG. 8) provide independent enhancements and further increase the transit frequency. Through use of both these optimisations together, the transit frequency will be increased further (not shown in FIG. 12).

The improved RF CMOS transistor designs described above provide designs which are not only smaller than a conventional cell but also can have an aspect ratio which is closer to one. This is compared to a conventional design where the need to reduce the channel width (as described above) leads to device layouts with a high aspect ratio. The reduced aspect ratio provided by the improved designs described herein reduces the parasitic resistances, capacitances and inductances of the device. It will be appreciated however, that the techniques described herein are not limited to use in designing RF transistors with an aspect ratio which is close to one and in some instances cells may be designed which have considerably higher aspect ratios and an example of such a design is shown in FIG. 14.

Figure 13:
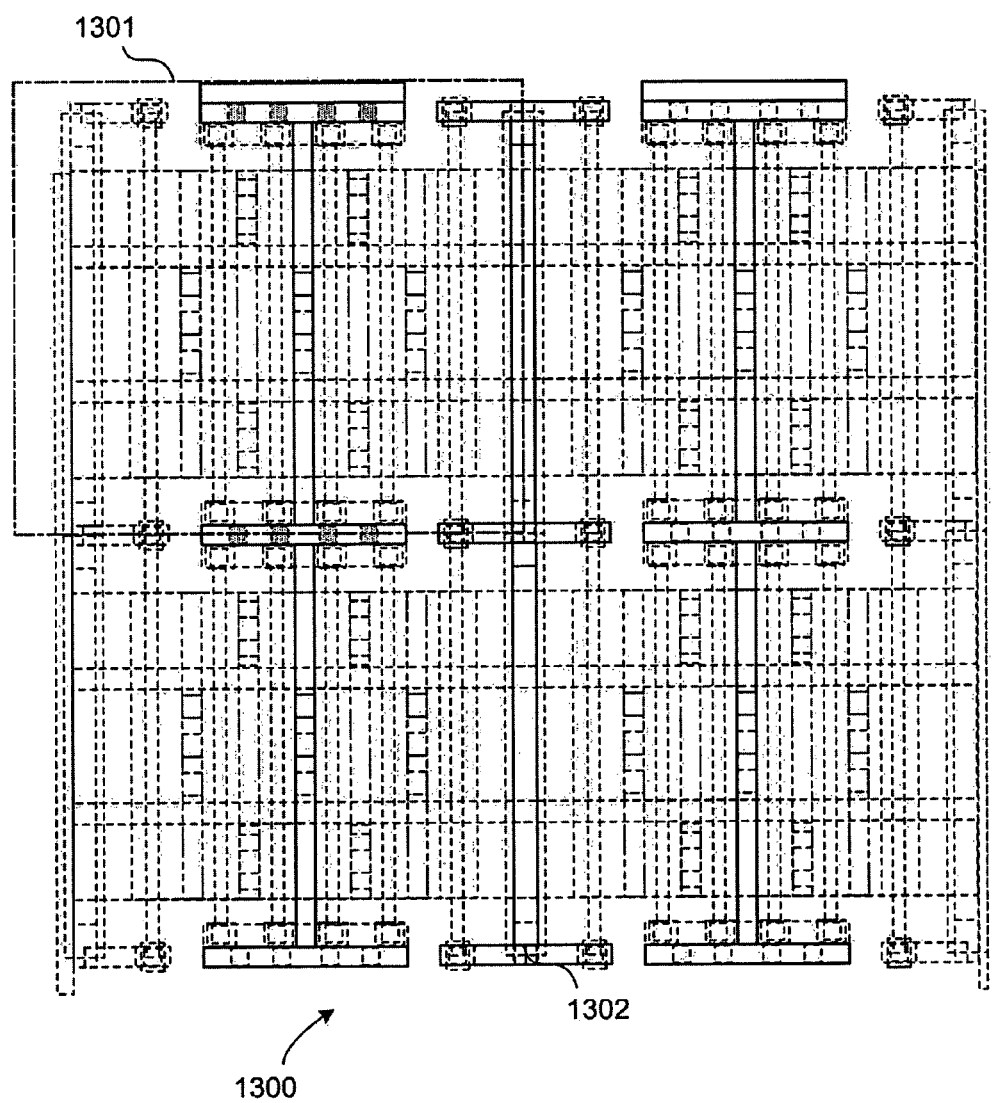
FIGS. 13-14 show schematic diagrams of transistor arrays formed by tiling an improved RF CMOS transistor design.

The improved RF CMOS transistor designs described above provide a cell where the opposite edges of the cell are equivalent, i.e. where the cell has mirror symmetry along one axis (e.g. the example shown in FIG. 6), and in some cases both axes (e.g. the example shown in FIG. 11). The improved designs described above provide the source and drain connections on each of two opposite edges of the cell and the gate connections on the two perpendicular edges of the cell. This equivalence enables the cell to be tiled easily to produce a transistor array and the improved designs described herein can be tiled in two dimensions (e.g. both horizontal (x) and vertical (y) directions), if required, in order to achieve a required total device width. FIG. 13 shows a schematic diagram of a transistor array 1300 which comprises a 2×2 array of ortho-cells 1301 (e.g. where each ortho-cell 1301 is as shown in FIG. 11) with NF=4.

The tiled arrangement shown in FIG. 13 can be compared to the conventional design (e.g. as shown in FIG. 1) where the source connection is on the opposite side of the cell to the drain connection and as a result the design can only be tiled in a single direction (the x direction). Tiling of a unit cell design (e.g. unit cell 1301) provides a transistor array where the required modelling effort may be reduced. For example, if the unit cell is modelled and characterised, the parameter space over which the combined RF-layout cell (i.e. the transistor array) needs to be characterised and modelled is reduced. This may be particularly beneficial where the transistors are fabricated using sub-100 nm CMOS technology, where additional effects introduced by strain and other process interactions often complicate the device modelling and simulation.

Figure 14:
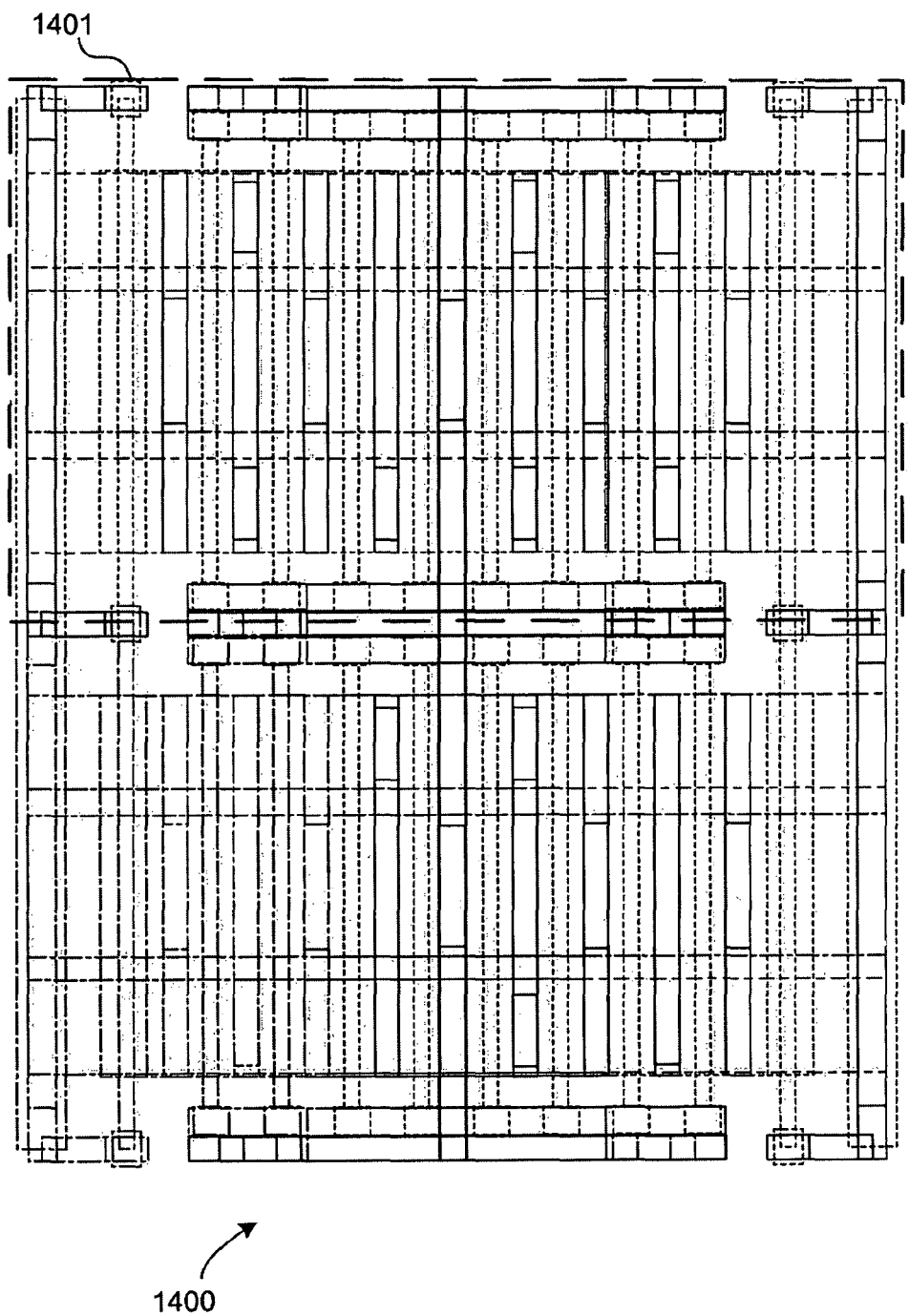

FIG. 14 shows an alternative tiling arrangement. The transistor array 1400 shown in FIG. 14 comprises a 1×2 array (NF=8) in which each unit cell 1401 has twice as many fingers as the unit cell 1301 shown in FIG. 13. This design requires less area than the design shown in FIG. 13 as a well-tap has been omitted (e.g. well-tap 1302 shown in FIG. 13); however the inclusion of the well-tap (as shown in the arrangement of FIG. 13) results in a lower noise device. The choice of which tiling strategy to use (e.g. that shown in FIG. 13 or FIG. 14) may therefore be design dependent: for example, where a low noise device is required, the design of FIG. 13 may be more appropriate, but where gate resistance is the key parameter, the design shown in FIG. 14 may be more suitable. Two dimensional arrays (as in FIG. 13) may also be used where otherwise the number of fingers (per unit cell) is outside the range of available modelling and characterisation.

The position of the gate connections and the avoidance of the gate straps around the periphery of each cell (e.g. through use of the third example optimisation described above) also improves the ability to tile the unit cell whilst avoiding loops in the gate connections which may provide undesirable effects (e.g. interference due to inductive coupling to the sensitive gate node). In the tiling arrangements shown in both FIGS. 13 and 14, there is only star routing of gate connections and no loops are introduced.

The examples described above show particular terminals being labelled as source terminals and particular terminals being labelled as drain terminals. However, in any of the examples described herein, the roles of the source and drain terminal lines may be interchanged.

Whilst the design improvements and additional optimisations described above provide particular benefits for processing schemes which use a copper interconnect, the techniques and designs described herein may be implemented in other processing technologies, e.g. whether other metals are used for the interconnect.

Although the design improvements and optimisations are described above in relation to an improved RF CMOS transistor, the techniques may be applied to any transistor (e.g. for non RF transistors) in any MOS process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term 'comprising' is used herein to mean including the method blocks or elements identified, but that such blocks or elements do not comprise and exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art.

Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A transistor for RF operation fabricated in a MOS process, the transistor comprising:
    an active area;
    a plurality of gate fingers;
    a plurality of local interconnect lines constrained substantially to above the active area of the transistor;
    a source terminal and a drain terminal arranged orthogonally to each of the plurality of local interconnect lines, wherein each terminal is electrically connected to at least one local interconnect line wherein the source terminal and the drain terminal are substantially wider than a local interconnect line and the source terminal and the drain terminal are routed above the active region, including above the gate fingers;
    a dummy gate electrode structure; and
    a well-tap adjacent to the dummy gate electrode structure, and wherein the dummy gate electrode structure is electrically connected to the well-tap.

2. A transistor according to claim 1, wherein the source terminal and the drain terminal are formed in different metal layers.

3. A transistor according to claim 1, further comprising a second drain terminal and wherein the drain terminals are arranged either side of the source terminal.

4. A transistor according to claim 1, further comprising a gate strap, and wherein the gate strap is routed substantially across the center of the transistor.

5. A transistor design according to claim 1, wherein a local interconnect line comprises at least one narrow portion adjacent to a wider portion, and wherein only the at least one narrow portion is connected directly to one of a source terminal and a drain terminal by means of at least one via.

6. A transistor design according to claim 1, further comprising a well-tie sharing said active area of the transistor.

7. An RF transistor design suitable for fabrication in a MOS process, the transistor design comprising:
- a plurality of gate fingers;
- a plurality of local interconnect lines constrained substantially to above an active area of the transistor;
- a source terminal and a drain terminal arranged orthogonally to each of the plurality of local interconnect lines, wherein each terminal is electrically connected to at least one local interconnect line;
- a dummy gate electrode structure; and
- a well-tap adjacent to the dummy gate electrode structure, wherein the source terminal and the drain terminal are substantially wider than a local interconnect line and the source terminal and the drain terminal are routed above the active region, including above the gate fingers;
- and wherein the dummy gate electrode structure is electrically connected to the well-tap.

8. A transistor design according to claim 7, wherein the source terminal and the drain terminal are formed in different metal layers.

9. A transistor design according to claim 7, further comprising a second drain terminal and wherein the drain terminals are arranged either side of the source terminal.

10. A transistor design according to claim 7, further comprising a gate strap, and wherein the gate strap is routed substantially across the center of the transistor.

11. A transistor design according to claim 7, further comprising a well-tie sharing said active area of the transistor.

12. A method of fabricating a transistor for RF operation comprising:
- forming an active area on a wafer;
- forming a plurality of gate fingers;
- forming a plurality of local interconnect lines constrained substantially above the active area in at least a first metal layer; and
- forming a source terminal and a drain terminal in at least one subsequent metal layer, wherein the source terminal and the drain terminal arranged orthogonally to each of the plurality of local interconnect lines and are substantially wider than a local interconnect line and the source terminal and the drain terminal are routed above the active area, including above the gate fingers and each terminal is electrically connected to at least one local interconnect line;
- forming a dummy gate electrode structure; and
- forming a well-tap adjacent to the dummy gate electrode structure, wherein the dummy gate electrode structure is electrically connected to the well-tap.

13. A method according to claim 12, wherein forming a source terminal and a drain terminal in at least one subsequent metal layer comprises:
- forming the source terminal in at least a second metal layer; and
- forming the drain terminal in at least a third metal layer.

14. A method according to claim 12, wherein forming a source terminal and a drain terminal in at least one subsequent metal layer comprises:
- forming the drain terminal in at least a second metal layer; and
- forming the source terminal in at least a third metal layer.

15. A method according to claim 12 further comprising:
- forming a gate strap in at least a fourth metal layer, and wherein the gate strap is routed substantially across the centre of the transistor.

16. A method according to claim 15, wherein:
- said at least a first metal layer comprises a metal-1 layer and a metal-2 layer;
- said at least a second metal layer comprises a metal-3 layer;
- said at least a third metal layer comprises a metal-4 layer and a metal-5 layer; and
- said at least a fourth metal layer comprises a metal-6 layer.

* * * * *